United States Patent
Tsironis (10) Patent No.: US 9,322,843 B1
(45) Date of Patent: Apr. 26, 2016

(54) METHOD FOR PLANARITY ALIGNMENT OF WAFER PROBES

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 162 days.

(21) Appl. No.: 13/846,997

(22) Filed: Mar. 19, 2013

(51) Int. Cl.
*G01R 1/067* (2006.01)
*G01R 31/28* (2006.01)

(52) U.S. Cl.
CPC ........ *G01R 1/06705* (2013.01); *G01R 1/06772* (2013.01); *G01R 31/2822* (2013.01)

(58) Field of Classification Search
CPC .. G01R 1/06772; G01R 1/24; G01R 31/2822; G01R 27/32; G01R 27/04; G01R 27/06; G01R 1/06705
USPC ........ 324/750.16, 750.22, 72.5, 95, 632–642; 333/248
See application file for complete search history.

(56) References Cited

U.S. PATENT DOCUMENTS

| | | | | |
|---|---|---|---|---|
| 4,266,191 A * | 5/1981 | Spano et al. | ............. | 324/750.23 |
| 4,677,474 A * | 6/1987 | Sato et al. | ........................ | 348/87 |
| 4,786,867 A * | 11/1988 | Yamatsu | .................. | 324/750.22 |
| 5,845,410 A * | 12/1998 | Boker | ............................. | 33/536 |
| 6,586,956 B2 * | 7/2003 | Aldaz et al. | .............. | 324/750.16 |
| 7,839,156 B2 * | 11/2010 | Yamada et al. | ........... | 324/750.25 |
| 8,554,502 B2 * | 10/2013 | Hon | ........................ | G01B 5/008 702/168 |
| 2002/0011856 A1 * | 1/2002 | Huang | ................ | G01R 1/06772 324/754.07 |
| 2003/0178988 A1 * | 9/2003 | Kim | .......................... | 324/158.1 |
| 2006/0022686 A1 * | 2/2006 | Fan et al. | ........................ | 324/754 |
| 2009/0189623 A1 * | 7/2009 | Campbell et al. | ............. | 324/754 |
| 2010/0001742 A1 * | 1/2010 | Strid et al. | ..................... | 324/601 |
| 2011/0025355 A1 * | 2/2011 | Liang | .................. | G01R 1/06705 324/750.19 |
| 2012/0087569 A1 * | 4/2012 | O'Dell et al. | ................. | 382/149 |

OTHER PUBLICATIONS

Cascade Microtech wafer probes: http://www.cascademicrotech.com/products/probes/rf-microwave/infinity-probe/ infinity-probe.
GGB wafer probes: http://www.ggb.com/40m.html.

* cited by examiner

*Primary Examiner* — Melissa Koval
*Assistant Examiner* — Felicia Farrow (57) ABSTRACT

A "Theta" angle adjustment tool is made of a solid parallel-epiped and adjusting screw, that allows the wafer probes to be fastened to the auxiliary equipment under correcting "Theta" angles. The procedure consists of loosening the probe and pressing hard on the tool to force the probe to adjust to the intended slope ("Theta") and then fastening the probe under pressure against the tool and chuck surface. Following that the marks left when the probe tips touch the wafer are assessed and corrective action is taken regarding "Theta misalignment".

3 Claims, 11 Drawing Sheets

Alignment tool used with waveguide probe.

Figure 1: Prior art: microwave wafer probe

Figure 2 (prior art): Microwave wafer probe (schematics)

Figure 3 prior art: probe tip marks on wafer chip plots

Figure 4, prior art: wafer probe mounting using flexible cable and theta adjustment Figure 5, prior art: millimeter-wave (waveguide) wafer probe Figure 6: Prior art, load pull setup using tuners and rigid bend-line Figure 7: Theta angle alignment block Figure 8: aligning wafer probe body flat on chuck surface; probe tips can be misaligned Figure 9: Corrected theta misalignment of probe tips Figure 10: Alignment tool used with coaxial probe FIG. 11: Alignment tool used with waveguide probe.

METHOD FOR PLANARITY ALIGNMENT OF WAFER PROBES

PRIORITY CLAIM

This application claims priority on provisional application 61/646,937 filed on May 15, 2012.

CROSS-REFERENCE TO RELATED ARTICLES

[1] Cascade Microtech wafer probes: http://www.cascademicrotech.com/products/probes/rf-microwave/infinity-probe/infinity-probe
[2] GGB wafer probes: http://www.ggb.com/40m.html

BACKGROUND OF THE INVENTION

Prior Art

RF and Microwave transistor chips are best characterized "on wafer". This allows avoidance of parasitic connection elements, like wire bonds and fringe capacitors, which are associated with packaging the devices in order to mount them in test fixtures. It also allows a much larger number of devices to be tested "in situ" without having to laboriously slice the wafer, mount and wire-bond each individual chip. The "on wafer" testing is at this time the preferred testing method, except for very high power devices, beyond 20 Watt RF power. On-wafer testing is also the exclusive testing method in millimeter-wave frequencies, since device packaging is extremely difficult and the parasitic elements associated with the package (inductance of wire bonds and fringe capacitors of package housings) would falsify the measured data to the point of uselessness.

Figure 1:
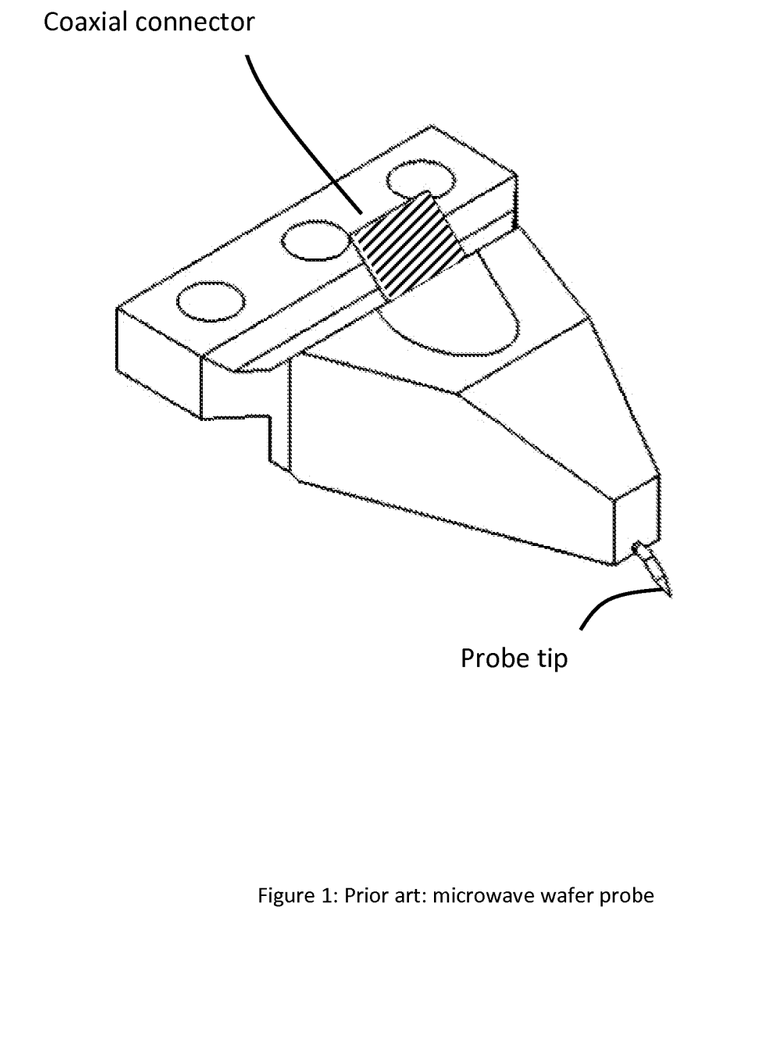
FIG. 1 depicts prior art, a coaxial microwave wafer probe [1].
Figure 2:
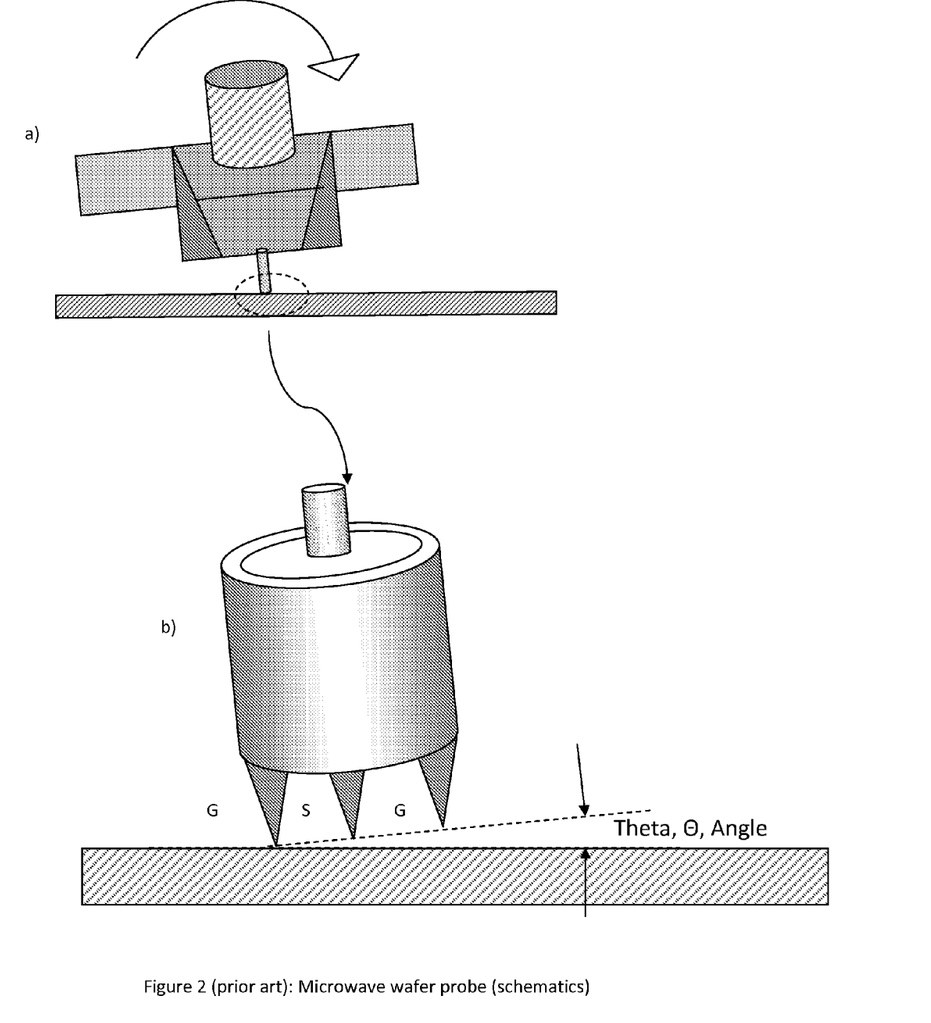
FIG. 2 depicts prior art, Theta angle misalignment of wafer probes and detail of probe tips.

A few manufacturers [1, 2] make wafer probes (FIG. 1) capable of reliably testing microwave chips. The microwave probes (FIGS. 1, 2a) are made, usually, using small coaxial cables with diameters of the order of 1 mm (0.04"), embedded in a solid body; the coaxial cables end into a "coplanar" structure, where the center conductor of the coaxial cable becomes the center conductor of the coplanar and the ground mantle of the coaxial cable ends up as the ground plane of the coplanar (FIG. 2b). The simple reason is that this is a practical way the RF signal can be injected and retrieved from planar micro-chips, where all RF contacts are on the same surface.

Figure 3:
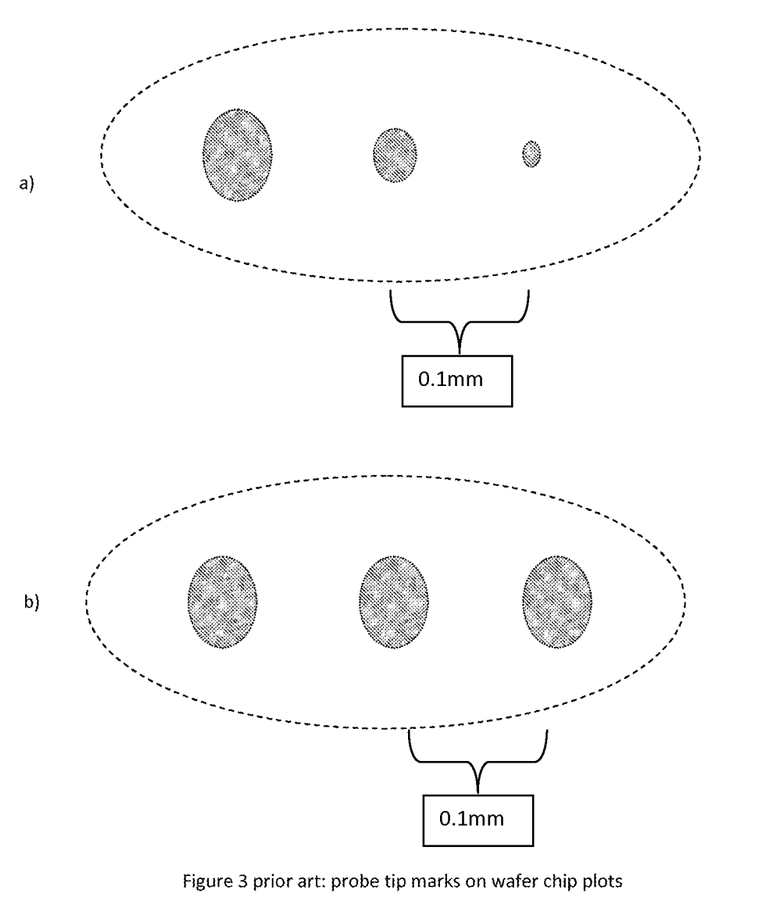
FIG. 3 depicts prior art, probe tip marks on a chip contact plot: a) misaligned, b) aligned.

Therefore at least three connection points are necessary to establish a GSG (Ground-Signal-Ground) contact (FIG. 2b). Since three points do not necessarily form a straight line and since the probes themselves may, due to the microscopic structures and manufacturing tolerances (distance between probe tips of the order of 150 micrometers (0.006"), it often happens that the contact between the probe tips and chip contact plots is uneven and unreliable (FIGS. 2b, 3a).

It is therefore necessary to have a planarization option: in the art of semiconductor device testing the misalignment angle between the chip-plot surface and the surface defined by the probe tips is called "Theta" (21, FIG. 2b); the process of aligning the probe tips with the chip-plot surface is called "Theta alignment" or "Theta adjustment".

Figure 4:
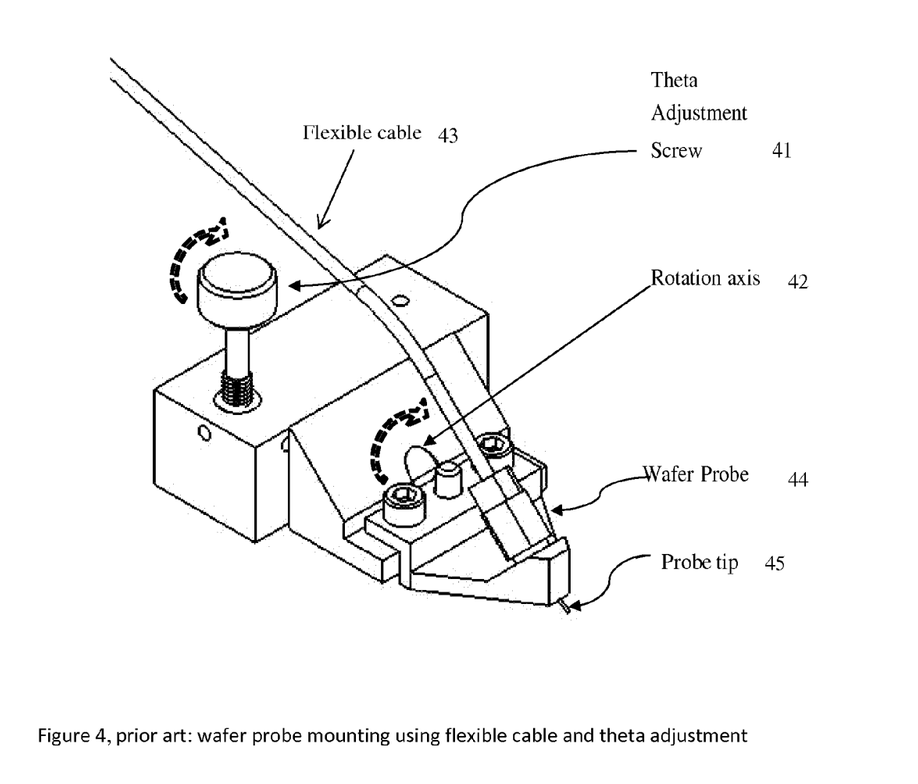
FIG. 4 depicts prior art, mechanism for continuous alignment of planarity (Theta) angle using micrometer screw and flexible microwave cable.

Usually, the coaxial connector of the wafer probe is connected to the test equipment (network analyzers, signal sources, power meters, etc.) using flexible coaxial cables (43, FIG. 4). In this case the "Theta adjustment" is done using a rotating base (42, 44) of the probe holder and a micrometer screw to adjust the angle of the probe tips (45). This ensures that the probe tips, when they make contact with the chip plots leave equal marks (FIG. 3b) instead of unequal marks (FIG. 3a) when the axis (22) through of probe (probe tips) is not parallel with the surface of the chip plots.

Figure 5:
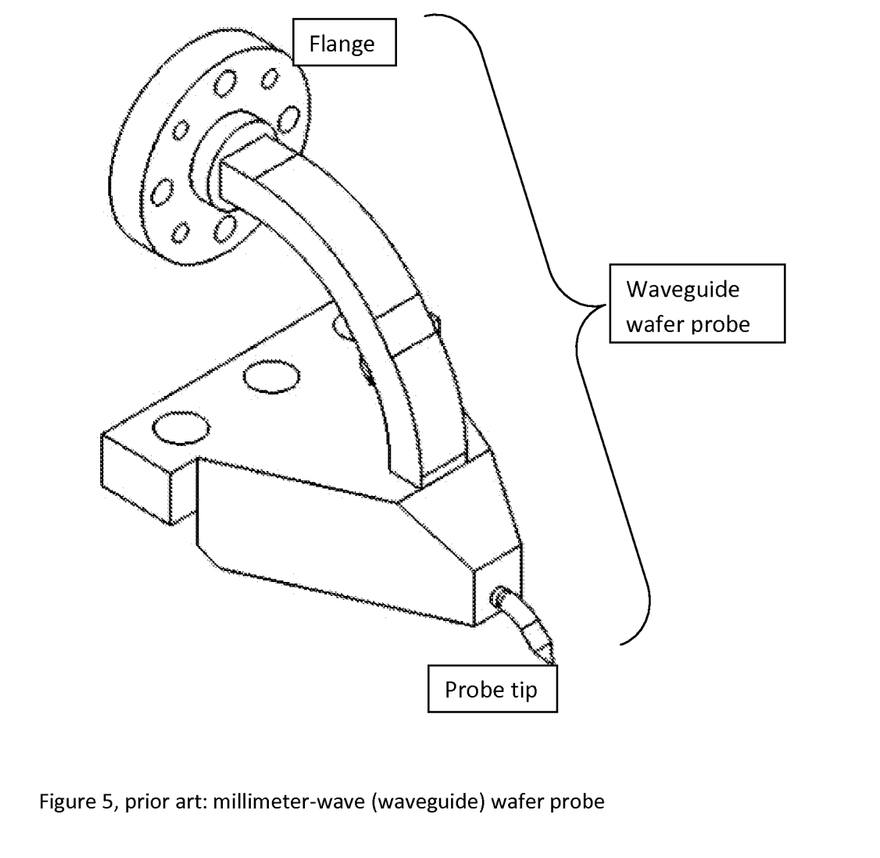
FIG. 5 depicts prior art, waveguide millimeter-wave wafer probe and waveguide bend section with flange.
Figure 6:
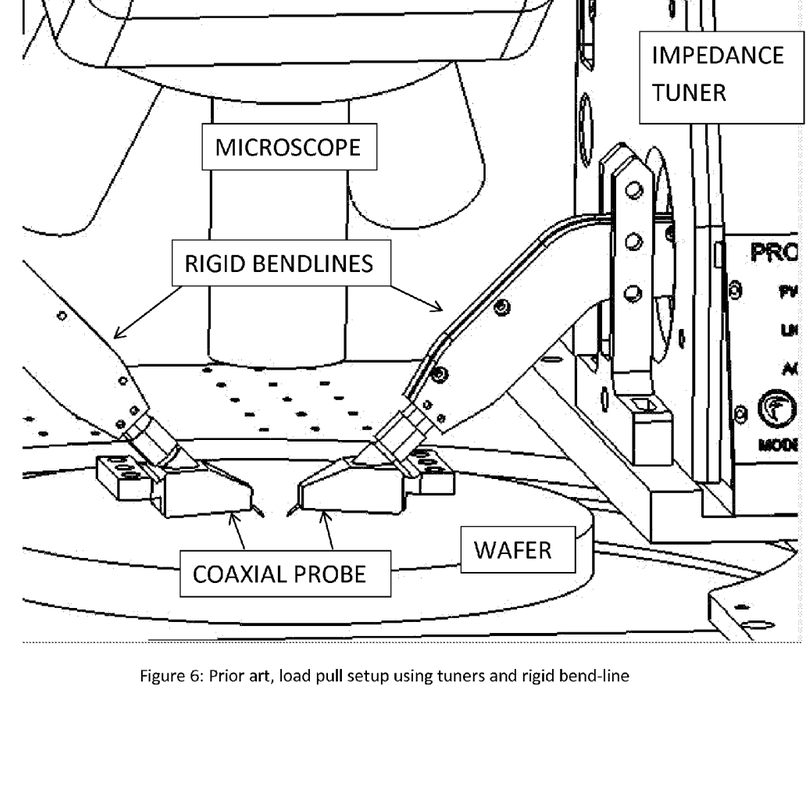
FIG. 6 depicts prior art, assembly of electro-mechanical impedance tuner with low loss slabline extension attached to wafer probe.

But in two important cases the "Theta alignment" mechanism of FIG. 4 cannot be used. This is the case (a) of millimeter-wave setups with waveguide probes (FIG. 5), because the waveguide flange is solidly screwed on the waveguide section of the auxiliary equipment, and (b) when the probes are used in a load pull test setup, where the flexible cable is replaced with a low loss rigid transmission airline ("bend-line", FIG. 6). In both such cases the probe cannot rotate freely, since it is rigidly connected with the supporting equipment (waveguide signal sources and receivers and/or impedance tuners) which are bulky and cumbersome to rotate and fix under various angles. In these cases provision must be taken for the probes to be "Theta aligned" before firmly fastened to the surrounding support equipment. This can be done but needs a special alignment tool. This method and associated tool is the purpose of this invention.

DESCRIPTION OF THE VARIOUS VIEWS OF THE DRAWINGS

The invention can be better understood in view of the attached drawings.

DETAILED DESCRIPTION OF THE INVENTION

The method and apparatus used to align the plane of wafer probes with the plane of microchip plots is outlined here forth.

Figure 7:
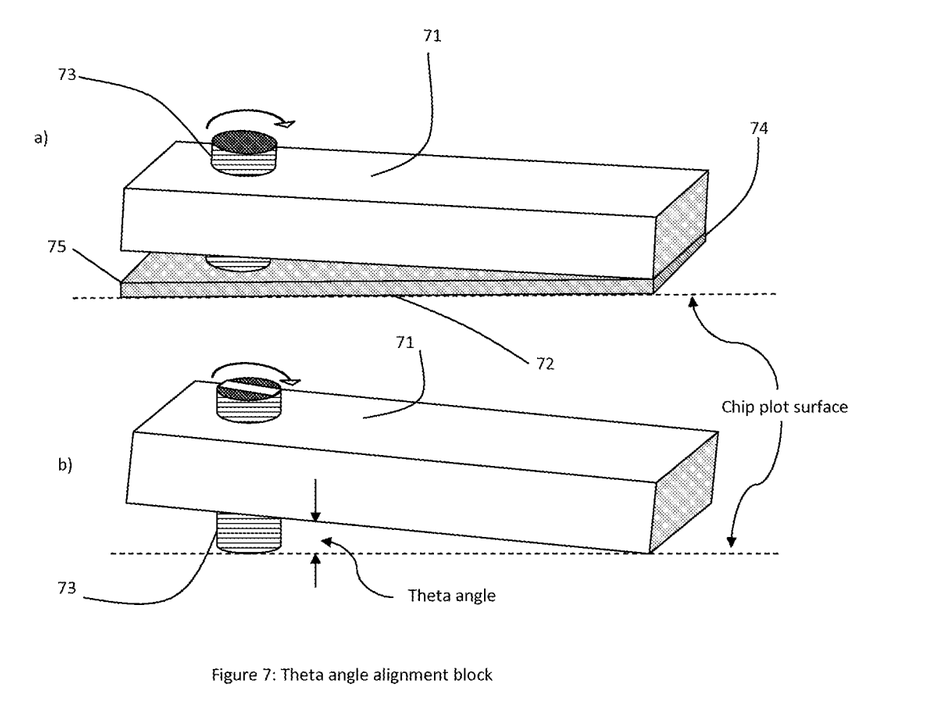
FIG. 7 depicts a planarity angle alignment device and adjustment screw: a) with top and bottom plates, b) with single top plate.

The "Theta alignment tool" is a device made as a set of one or two blocks of metal or hard plastic (parallelepiped) and comprises up to two sections: one bottom fixed section (75) and one adjustable top section (71) section, having both a form of a parallelepiped. A vertical screw (73) threaded through the top section allows adjusting continuously the angle opening between the top and bottom sections (FIG. 7a). The sections are joined together at one end (74) and free on the other; the free end (75) is then pushed away with the screw. The main reason for using two flat sections rather than simply a protruding screw (as shown in FIG. 7b) is practical:

to avoid scratching or leaving marks on the surface of the wafer chuck when used to align the probe tips. Depending on the hardness of the material of the chuck surface, the bottom section can be omitted and leave only the top of the screw (73) protruding from the top section (71) to define the slope (=Theta angle), between the top section and the wafer surface, FIGS. 7a) and 7b). Alternative a plastic screw can be used to avoid scratches.

Figure 8:
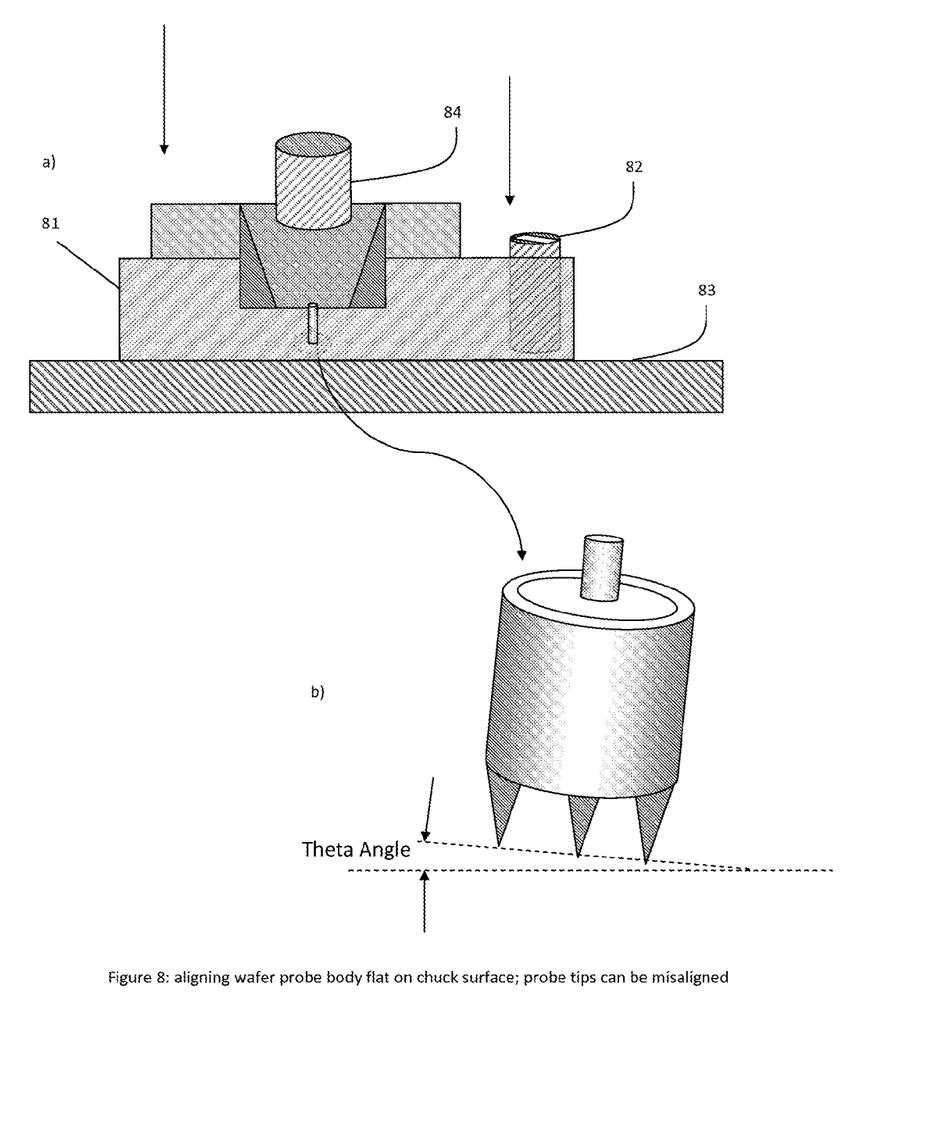
FIG. 8 depicts procedure for aligning planarity angle, step 1, identifying possible misalignment.
Figure 9:
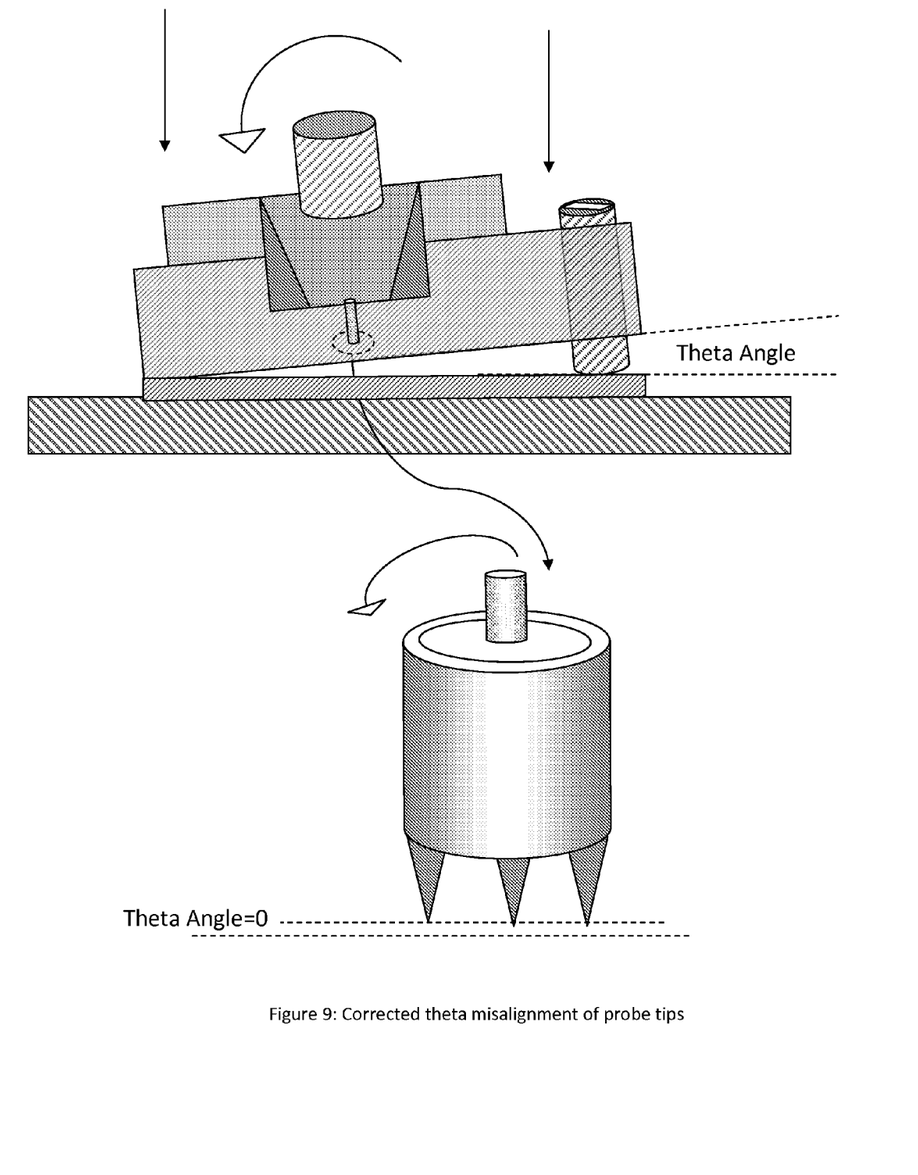
FIG. 9 depicts procedure for aligning planarity angle, step 2, correcting misalignment by adjusting and applying the alignment device.
Figure 10:
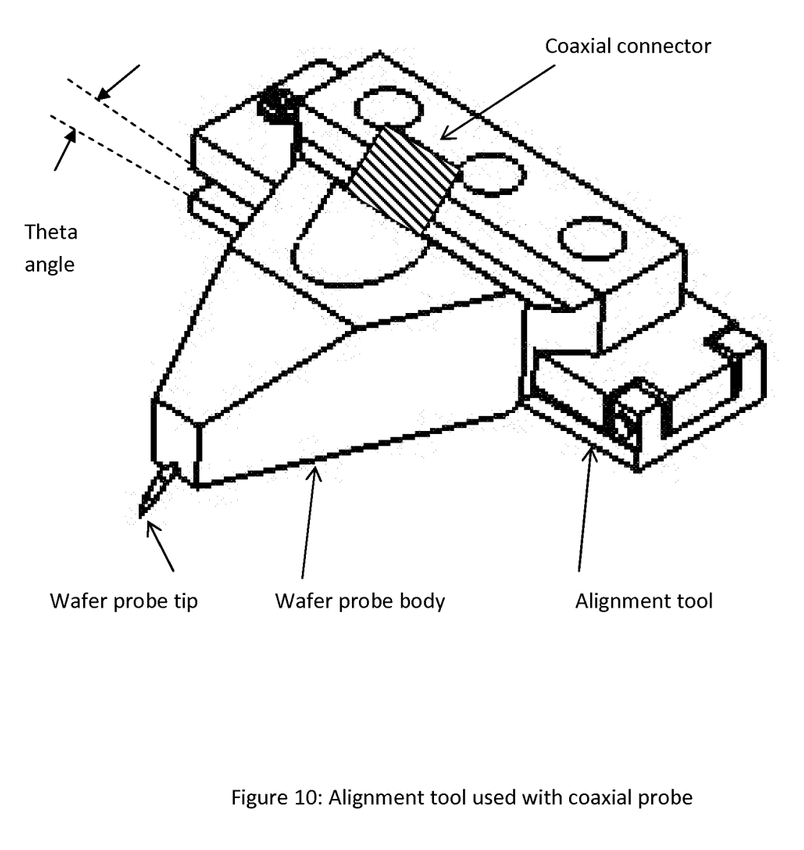
FIG. 10 depicts application of alignment device on coaxial wafer probe.
Figure 11:
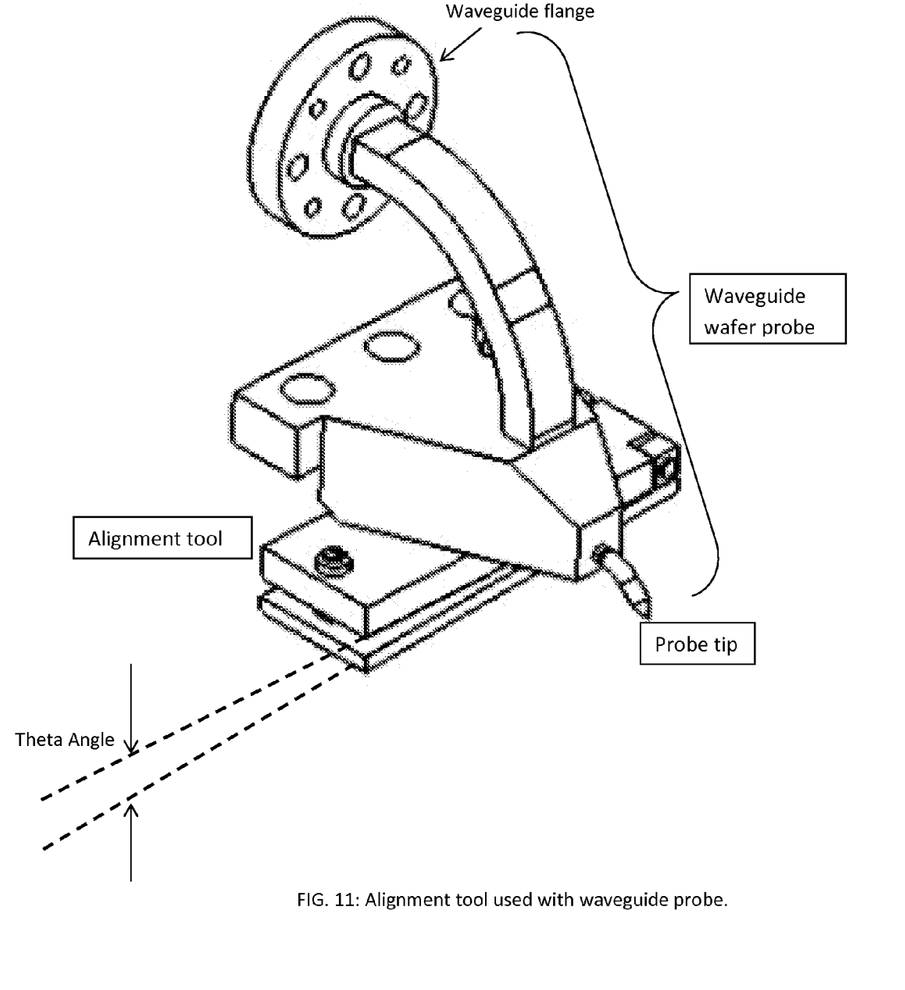
FIG. 11 depicts application of alignment device on waveguide wafer probe.

The method for aligning the probe tip axis (22) comprises the following steps:

I. in a first (orientation) step the probes are placed flat (parallel) to the wafer/chuck surface (83); this is done by using the alignment tool (81) (FIG. 8) as a pure parallelepiped (the adjusting screw (82) is fully retracted); the probes are loosened from the connector binds (84), so they can rotate, and pressed down firmly, so their body is parallel to the chuck surface (this takes place in a section of the chuck where there is no semiconductor wafer);

II. the probes are lifted and the wafer is positioned under the probe tips, whereby the tips hover over the chip plots; then the probes are lowered to make contact with the chip plots and lifted again leaving marks on the chip plots (FIG. 3);

III. the marks of the probe tips are assessed visually by the operator through the microscope (FIG. 3); with some trials the intensity and size of the marks is related to the misalignment (if any) of the probe tips and the required "Theta correction" angle;

IV. the screw in the alignment tool (block) is adjusted to create the expected "Theta" correction angle" in the alignment device (FIG. 7);

V. the probes are moved up and away from the wafer, loosened from the rigid connectors and again pressed down on the alignment block, to assume the corrected slope (Theta) and are fastened, while firmly pressed on the alignment block, to the connectors of the auxiliary equipment (FIG. 9);

VI. the probes are moved again over the wafer and lowered to make contact, leaving marks on the chip plots, which are then assessed visually under the microscope;

IV. depending on the intensity (diameter) of the tip marks on the wafer plots (FIG. 3) the "Theta" angle of the alignment block is re-adjusted and the procedure is repeated, starting with step V.

What is claimed is:

1. A wafer-probe "Theta alignment" device allowing adjusting the planarity of wafer probe tips against a wafer surface:

wherein the wafer probes are connected to a probe housing using rigid coaxial links;

said wafer probes comprising probe tips mounted in said probe housing and an attached coaxial connector;

said wafer-probe "Theta alignment" device comprising a top and a bottom solid parallelepiped block, said blocks being joined at one end and separated at the opposing end, and an adjusting screw which threads through the top and bottom blocks at the opposing end, said adjusting screw protrudes and controls the opening angle between the top and bottom blocks by pushing away the opposing end of the top block from the bottom block.

2. A wafer-probe "Theta alignment" device as in claim 1, wherein the top and bottom blocks are made of metal or hard plastic.

3. A Theta angle alignment procedure for wafer probes employing the wafer probe "Theta alignment" device, as in claim 1, as follows:

a) withdraw the adjusting screw of the wafer-probe "Theta alignment" device;

b) loosen the coaxial connector between the probe and the attached equipment;

c) insert the wafer-probe "Theta alignment" device between the top surface of a wafer station and the bottom of the probe housing;

d) press the probe housing on the wafer-probe "Theta alignment" device and fasten the coaxial connector;

e) remove the wafer-probe "Theta alignment" device, insert a semiconductor wafer and make contact of the probe tips with the semiconductor wafer;

f) assess visually the marks created by the probe tips on the wafer surface and adjust the slope of the wafer-probe "Theta alignment" device by inserting and rotating the adjustment screw in order to compensate for the differences in diameter of the tip marks on said semiconductor wafer;

g) determine if the marks on said semiconductor wafer are equal; determine if the probe tips show planarity; and determine if no further adjustment is needed by the wafer-probe "Theta alignment" device;

h) determine if the marks are unequal, determine if adjusting the angle between top and bottom blocks of the alignment device is needed by turning said adjusting screw;

i) repeat the method recited in steps c) through h) until the probe tip marks are approximately equal.

\* \* \* \* \*